United States Patent
Held et al.

(10) Patent No.: US 10,591,522 B2
(45) Date of Patent: Mar. 17, 2020

(54) MEASUREMENT APPARATUS

(71) Applicant: Rohde & Schwarz GmbH & Co. KG, München (DE)

(72) Inventors: Werner Held, Pocking (DE); Martin Leibfritz, Aying (DE); Marcel Ruf, Erlangen (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 407 days.

(21) Appl. No.: 15/299,947

(22) Filed: Oct. 21, 2016

(65) Prior Publication Data
US 2017/0160321 A1   Jun. 8, 2017

(30) Foreign Application Priority Data

Dec. 4, 2015   (EP) .................................... 15198013

(51) Int. Cl.
| | | |
|---|---|---|
| G01R 23/163 | (2006.01) | |
| G01R 15/12 | (2006.01) | |
| G01R 27/06 | (2006.01) | |
| G01R 31/26 | (2014.01) | |

(52) U.S. Cl.
CPC .......... *G01R 23/163* (2013.01); *G01R 15/12* (2013.01); *G01R 27/06* (2013.01); *G01R 31/2601* (2013.01)

(58) Field of Classification Search
CPC ...... G01R 23/163; G01R 15/12; G01R 27/06; G01R 31/2601
USPC .................................................... 324/76.19
See application file for complete search history.

(56) References Cited

U.S. PATENT DOCUMENTS

| | | | |
|---|---|---|---|
| 6,396,298 B1* | 5/2002 | Young ................ | G01R 31/2621 324/762.09 |
| 7,633,308 B1 | 12/2009 | Sobolewski et al. | |
| 2003/0055613 A1* | 3/2003 | Tsai ...................... | G01R 27/28 703/2 |
| 2010/0176789 A1 | 7/2010 | Zoughi et al. | |
| 2011/0316575 A1 | 12/2011 | Nojima | |
| 2013/0234741 A1* | 9/2013 | Mow ..................... | H01Q 1/243 324/750.01 |
| 2015/0091601 A1* | 4/2015 | Ding ................... | G01R 31/2623 324/762.01 |

FOREIGN PATENT DOCUMENTS

GB    2058365 A    4/1981

OTHER PUBLICATIONS

Costa et al.; "Modeling a New Generation of RF Devices: MOSFETs for L-Band Applications"; Jun. 18, 1993; 1993 IEEE MTT-S International Microwave Symposium Digest; IEEE; p. 293-296 (Year: 1993).*

(Continued)

*Primary Examiner* — Melissa J Koval
*Assistant Examiner* — Rahul Maini
(74) *Attorney, Agent, or Firm* — Shumaker & Sieffert, P.A.

(57) ABSTRACT

A measurement apparatus (1) comprising a high frequency measurement unit (2) adapted to measure high frequency parameters (HFP) of a device under test (DUT) connected to ports of said measurement apparatus (1) and a multimeter unit (3) adapted to measure DC characteristics parameters (DCP) of said device under test (DUT) connected via control signal lines (CL) to a control bus interface (6) of said measurement apparatus (1).

13 Claims, 4 Drawing Sheets

(56) References Cited

OTHER PUBLICATIONS

Teyssier et al.; "A pulsed S-parameters measurement setup for the non-linear characterization of FETs and bipolar power transistors"; Sep. 10, 1993; 1993 23rd European Microwave Conference; IEEE; 489-493 (Year: 1993).*
Extended European Search Report from counterpart European Patent Application No. 15198013.3, dated May 24, 2016, 6 pp.
Response to European Search Report dated May 24, 2016, from counterpart European Patent Application No. 15198013.3, filed on Sep. 13, 2017, 26 pp.

* cited by examiner

MEASUREMENT APPARATUS

PRIORITY CLAIM

This application claims the benefit of European Patent Application No. 15198013.3, filed Dec. 4, 2015; the disclosure of which is incorporated herein by reference in its entirety.

TECHNICAL FIELD

The invention relates to a measurement apparatus adapted to measure high frequency parameters and DC characteristics of a device under test DUT in parallel.

TECHNICAL BACKGROUND

A device under test DUT can comprise any electronic circuit with one or several components. For example, the front end module FEM of a smartphone can be tested during design or after production of the front end module. A device under test DUT to be tested by a measurement apparatus can comprise different kinds of components including passive and active components. Many of these components need to be characterized for both linear and non-linear behaviour. A conventional network analyzer can measure both linear and non-linear behaviour of devices under test DUT. A conventional network analyzer can measure high frequency parameters of a device under test DUT connected to test ports of the network analyzer. The properties of an electrical single port or multiport circuit can be determined by scattering parameters. These scattering parameters are formed by quotients of incoming and outgoing waves at the gates of the device under test DUT which are measured by the network analyzer. The measured scattering parameters or S-parameters of several devices under test DUT can be cascaded to predict an overall system performance.

In a conventional test setup, the high frequency parameters of a device under test DUT are measured by a network analyzer whereas DC characteristics of the device under test DUT can be measured by a separate multimeter apparatus. Such a conventional test setup has several drawbacks. The measurement of the high frequency parameters and the DC characteristic parameters is performed by two separate measurement devices increasing the complexity of the measurement setup. Moreover, the measurement of the high frequency parameters and the DC characteristics of the device under test DUT cannot be performed simultaneously increasing the necessary testing time. An even more severe drawback is that the high frequency parameters provided by the network analyzer and the DC characteristics provided by the multimeter apparatus are not linked to each other so that it becomes very difficult to recognize dependencies between high frequency parameters and low frequency DC characteristics of the investigated device under test, DUT. Accordingly, there is need to provide a measurement apparatus which allows a fast and transparent measurement of device under test parameters.

SUMMARY OF THE INVENTION

The invention provides according to a first aspect a measurement apparatus comprising
a high frequency measurement unit adapted to measure high frequency parameters of a device under test connected to test ports of said measurement apparatus and
a multimeter unit adapted to measure simultaneously DC characteristics of said device under test connected via control signal lines to said measurement apparatus via a DC link.

In a possible embodiment the measurement of the DC characteristics by said multimeter and the measurement of the high frequency parameters by said high frequency measurement unit is performed simultaneously.

In a possible embodiment of the measurement apparatus according to the first aspect of the present invention, the multimeter unit is adapted to measure a DC current and/or a DC supply voltage at each control signal line connected to the control bus interface of said measurement apparatus.

In a further possible embodiment of the measurement apparatus according to the first aspect of the present invention, the multimeter unit is adapted to measure the DC characteristics of said device under test during the measurement of the high frequency parameters by said high frequency measurement unit.

In a further possible embodiment of the measurement apparatus according to the first aspect of the present invention, the apparatus comprises a display unit adapted to display at least one high frequency parameter measured by said high frequency measurement unit simultaneously with at least one DC characteristic parameter measured by said multimeter unit.

In a possible embodiment of the measurement apparatus according to the first aspect of the present invention, the high frequency measurement unit is adapted to measure scattering parameters of said device under test comprising
a forward reflection coefficient,
a reverse reflection coefficient,
a forward transmission coefficient and
a reverse transmission coefficient.

In a possible embodiment the high frequency measurement unit is adapted to provide a bode diagram of measured parameters of said device under test.

In a possible embodiment of the measurement apparatus according to the first aspect of the present invention, the measurement apparatus further comprises a built-in signal generator adapted to supply a stimulus signal to said device under test.

In a further possible embodiment of the measurement apparatus according to the first aspect of the present invention, the display unit of the measurement apparatus is adapted to display a frequency-dependent high frequency parameter and a frequency-dependent DC characteristic parameter simultaneously for a selectable frequency range.

In a possible embodiment of the measurement apparatus according to the first aspect of the present invention, the control bus interface of the measurement apparatus comprises a radio frequency front end, RFFE, interface.

In a possible embodiment of the measurement apparatus according to the first aspect of the present invention, the measurement apparatus comprises an integrated power supply unit adapted to provide a power supply to the device under test.

In a further possible embodiment of the measurement apparatus according to the first aspect of the present invention, the multimeter unit comprises a digital multimeter unit adapted to measure DC characteristic parameters of each control signal line connected to said control bus interface.

In a further possible embodiment of the measurement apparatus according to the first aspect of the present invention, the multimeter unit is implemented on a plug-in card of said measurement apparatus.

In a further possible alternative embodiment of the measurement apparatus according to the first aspect of the present invention, the multimeter unit is connected via a data interface to said measurement apparatus.

In a further possible embodiment of the measurement apparatus according to the first aspect of the present invention, the measurement apparatus comprises a data evaluation unit adapted to evaluate the high frequency parameters measured by said high frequency measurement unit and the DC characteristics measured by the multimeter unit to analyze the respective device under test.

In a possible embodiment of the measurement apparatus according to the first aspect of the present invention, the data evaluation unit comprises a processing unit adapted to perform a correlation calculation between at least one high frequency parameter measured by the high frequency measurement unit and a DC characteristic parameter measured by the multimeter unit to provide an evaluation result.

In a further possible embodiment of the measurement apparatus according to the first aspect of the present invention, the evaluation result provided by the data evaluation unit is displayed by the display unit of said measurement apparatus along with the respective high frequency parameter and the corresponding DC characteristic parameter.

In a further possible embodiment of the measurement apparatus according to the first aspect of the present invention, the device under test connected to the measurement apparatus is formed by a component of a front end module.

The invention provides according to the second aspect a vector network analyser VNA comprising a measurement apparatus having
a high frequency measurement unit adapted to measure high frequency parameters of a device under test connected to test ports of said vector network analyzer and
a multimeter unit adapted to measure DC characteristic parameters of the device under test connected via control signal lines to a control bus interface of said vector network analyzer.

The invention provides according to the third aspect a spectrum analyzer comprising a measurement apparatus having
a high frequency measurement unit adapted to measure high frequency parameters of a device under test connected to test ports of said spectrum analyzer and
a multimeter unit adapted to measure DC characteristic parameters of said device under test connected via control signal lines to a control bus interface of said spectrum analyzer.

The invention further provides according to a fourth aspect a method comprising the features of claim 16.

The invention provides according to the fourth aspect a method for recognizing automatically a dependency between a high frequency behavior and a low frequency behavior of a device under test, comprising the steps of:
measuring at least one high frequency parameter of the device under test by a high frequency measurement unit of a measurement apparatus,
measuring at least one DC characteristic parameter of the device under test simultaneously by a multimeter unit of the measurement apparatus, and
providing correlation parameters on the basis of the measured high frequency parameter and the measured DC characteristic parameter to identify a dependency between a high frequency behavior and a low frequency behavior of the device under test.

BRIEF DESCRIPTION OF FIGURES

In the following, possible exemplary embodiments of the different aspects of the present invention are described in more detail with reference to the enclosed figures.

DETAILED DESCRIPTION OF EMBODIMENTS

Figure 1:
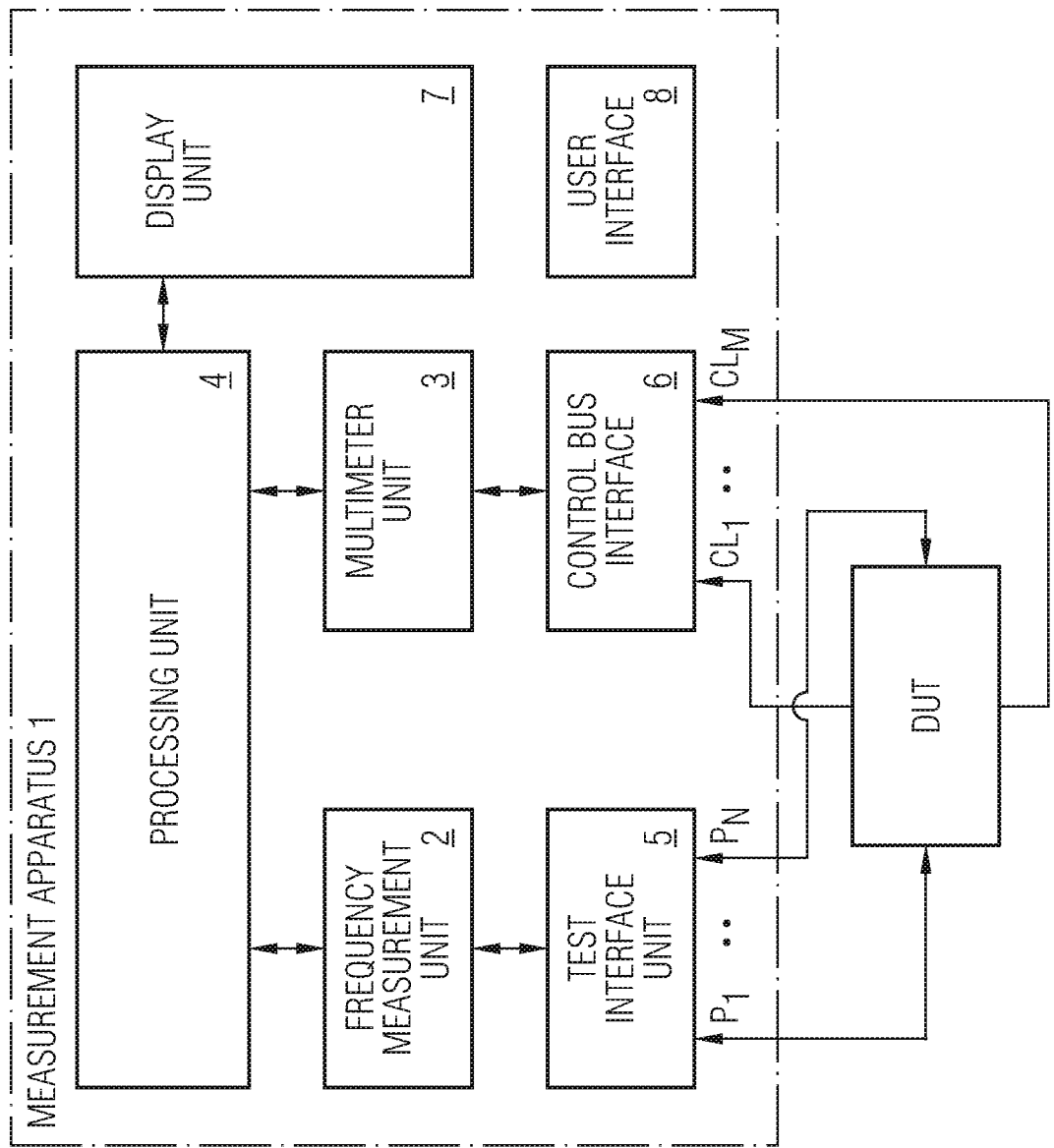
FIG. 1 shows a block diagram of a possible exemplary embodiment of a measurement apparatus according to an aspect of the present invention.

As can be seen in FIG. 1, the measurement apparatus 1 comprises in the illustrated embodiment several subunits including a high frequency measurement unit 2 and a multimeter unit 3. In the embodiment shown in FIG. 1, the multimeter unit 3 is integrated in the measurement apparatus 1. In the shown embodiment, the high frequency measurement unit 2 and the multimeter unit 3 are both connected to a processing unit 4 of the measurement apparatus 1. The high frequency measurement unit 2 is connected via a test interface 5 and several test ports to a device under test, DUT. Further, the multimeter unit 3 is connected via a control bus interface 6 and control signal lines CL to the same device under test DUT. The high frequency measurement unit 2 of the measurement apparatus 1 is adapted to measure high frequency parameters, HFP, of the device under test DUT connected to the test ports, TP, of the measurement apparatus 1. The multimeter unit 3 of the measurement apparatus 1 is adapted to measure at the same time DC characteristics, DCP, of the device under test DUT connected via the control signal lines, CL, to the control bus interface 6 of the measurement apparatus 1 as illustrated in FIG. 1.

The measurement apparatus 1 further comprises a display unit 7 adapted to display at least one high frequency parameter, HFP, measured by said high frequency measurement unit 2 and/or at least one DC characteristic parameter, DCP, measured by the multimeter unit 3. In a possible embodiment, the measurement apparatus 1 further comprises a user interface 8 for selecting different display modes on the display unit 7. In a possible embodiment, a user can select a display mode where at least one high frequency parameter, HFP, measured by said high frequency measurement unit 2 is displayed simultaneously with a DC characteristic parameter, DCP, measured by the multimeter unit 3 on the display unit 7 of the measurement apparatus 1.

In a possible embodiment, the high frequency measurement unit 2 is adapted to measure different high frequency parameters including scattering parameters of the device under test, DUT. The high frequency measurement unit 2 measures in a possible embodiment as scattering parameters, a forward reflection coefficient S11, a reverse reflection coefficient S22, a forward transmission coefficient S21 and/or a reverse transmission coefficient S12 of the device under test, DUT. In a possible embodiment, a user can select at least one high frequency parameter, HFP, provided by the high frequency measurement unit 2 to be displayed along with at least one DC characteristic parameter, DCP, provided by the multimeter unit 3 on a display of the display unit 7. The scattering parameters can comprise complex quantities. In a possible embodiment the high frequency measurements performed by the high frequency measurement unit 2 are performed at a frequency of more than 1 MHZ.

Figure 2:
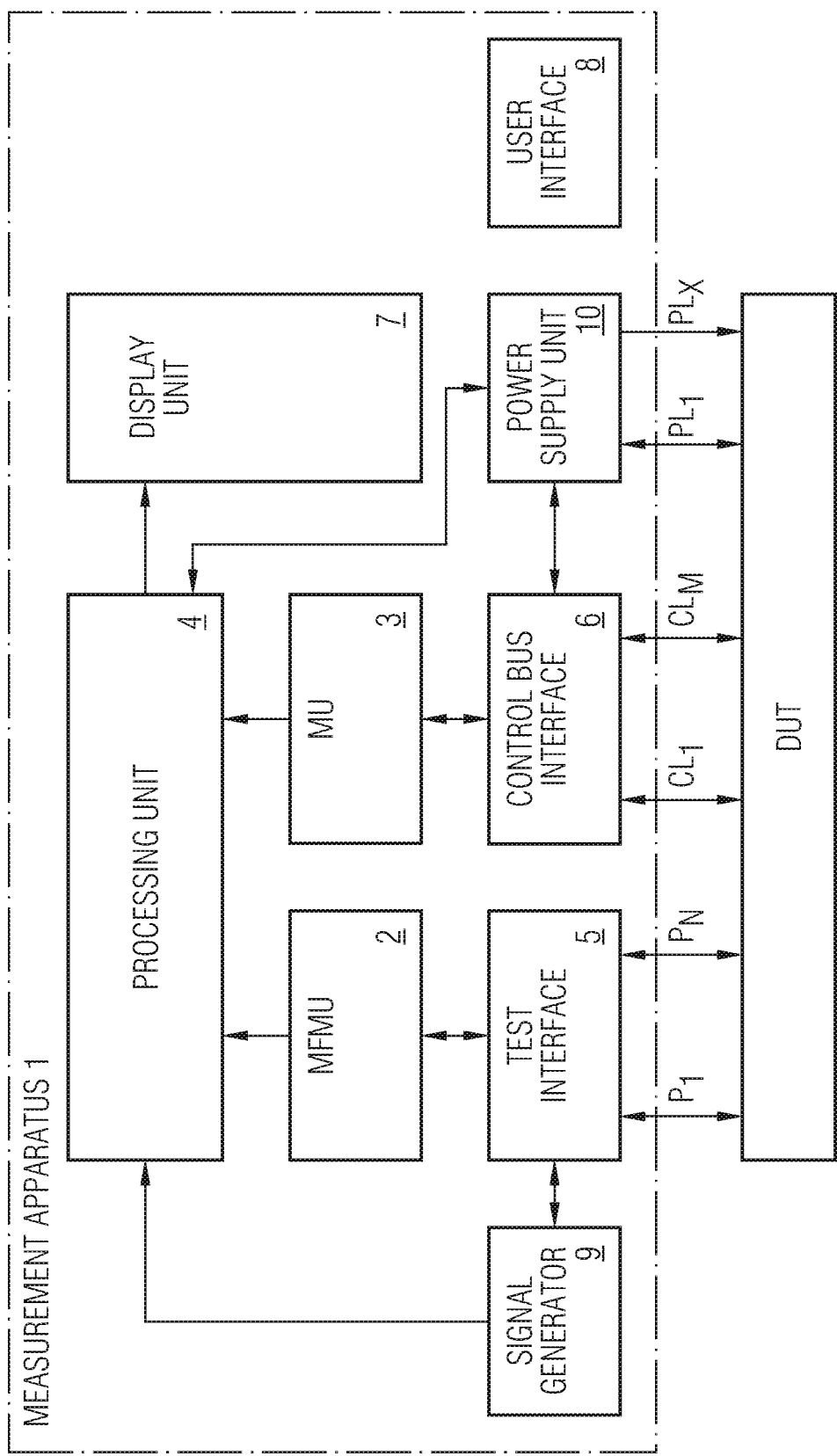
FIG. 2 shows a block diagram of a further possible exemplary embodiment of a measurement apparatus according to an aspect of the present invention.

FIG. 2 shows a block diagram of a possible embodiment of the measurement apparatus 1. In the illustrated exemplary embodiment, the measurement apparatus 1 further comprises a built-in signal generator 9 adapted to supply a stimulus signal to the device under test DUT via the test interface 5. In a possible embodiment, the frequency of the signal source is swept. Alternatively, the power level of the signals provided by the signal source can be swept over a predetermined range. The test interface 5 of the measurement apparatus 1 receives the stimulus signal generated by the built-in signal generator 9 and routes it to the device under test DUT. Further, the test interface 5 can route a signal to be measured to receivers of the high frequency measurement unit 2. The test interface 5 can comprise signal separation components to split off a reference channel for an incident wave. The reference channel is provided to serve as a phase reference. Directional couplers or splitters can be used for signal separation. A signal separation coupler of the test interface 5 is provided to measure a portion of the incident signal to provide a reference. Further, the signal-splitting hardware of the test interface 5 is provided to separate the incident (forward) and reflected (reverse) travelling wave at the input of the respective device under test, DUT. The high frequency measurement unit 2 can comprise one or several receivers connected to the test ports P1 to $P_n$ of the test interface 5 as illustrated in FIG. 2. The number N of test ports P can vary. In a possible embodiment, the measurement apparatus 1 can comprise a reference test port. The receiver of the high frequency measurement unit 2 is adapted to measure both the magnitude and the phase of the received signal. In a possible embodiment, the reference channel and the test channels are downconverted to allow a measurement at a lower frequency. The high frequency measurement unit 2 can comprise several receivers to permit simultaneous measurement of different high frequency parameters of the device under test DUT. The generated high frequency signal provided by the signal generator 9 is either reflected from or transmitted through the device under test DUT. By measuring the amplitude ratios and phase differences between the two waves, it is possible to characterize the reflection (impedance) and transmission (gain) characteristics of the device under test DUT. In a possible embodiment, the device under test DUT connected to the test interface 5 can be a two-port circuit network such as an amplifier, a filter, a cable or a signal antenna. The signal generator 9 generates a stimulus signal applied as an incident signal to stimulate the device under test DUT. The device under test DUT responds by reflecting part of the incident energy and transmitting the remaining parts. By sweeping a frequency of the generated stimulus signal, the frequency response of the device under test DUT can be determined by the high frequency measurement unit 2. The test interface 5 is provided to separate the incident, reflected and transmitted signals of the device under test DUT connected to the test ports of the measurement apparatus 1. Once separated the individual magnitude and/or phase differences are measured by the high frequency measurement unit 2. Signal separation can be accomplished by wideband directional couplers, bridges or power splitters. Once the high frequency signals have been detected by the high frequency measurement unit 2 they can be processed by the processing unit 4 and displayed on the display unit 7. The measurement apparatus 1 can comprise a high frequency measurement unit 2 with multi-channel receivers utilizing a reference channel and at least one test channel. The high frequency measurement unit 2 can measure absolute signal levels in the channels, relative signal levels (ratios) between the channels or relative phase differences between channels. Relative ratio measurements are usually measured in decibel dB which is the log ratio of an unknown test signal to a chosen reference signal. Further, phase measurements can be performed with respect to a reference channel signal having a zero phase.

In the illustrated embodiment of FIG. 2, the measurement apparatus 1 further comprises a power supply unit 10 adapted to provide a power supply to the device under test DUT. In the illustrated embodiment, the power supply unit 10 is integrated in the measurement apparatus 1 allowing to supply the device under test DUT with power during the measurement performed by the high frequency measurement unit 2 and the multimeter unit 3. The multimeter unit 3 is in a preferred embodiment a digital multimeter unit. The digital multimeter unit 3 of the measurement apparatus 1 can provide autoranging to select a correct range for the DC parameter of the device under test so that the most significant digits are automatically displayed on the display unit 7. Further, the digital measurement unit 3 can provide an autopolarity function for direct current readings to show whether the voltage applied via a control line CL to the device under test DUT is positive or negative. In a possible embodiment, the measurement unit 3 comprises a memory for storing acquired DC characteristic parameter data temporarily for further processing by the processing unit 4. In the embodiment, illustrated in FIG. 2, the multimeter measurement unit 3 is integrated in the measurement apparatus 1. In a further possible embodiment, the multimeter unit 3 can be implemented on a plug-in card plugged into an internal bus of the measurement apparatus 1. In a still further possible alternative embodiment, the multimeter unit 3 can be connected via a data interface to the measurement apparatus 1.

Figure 3:
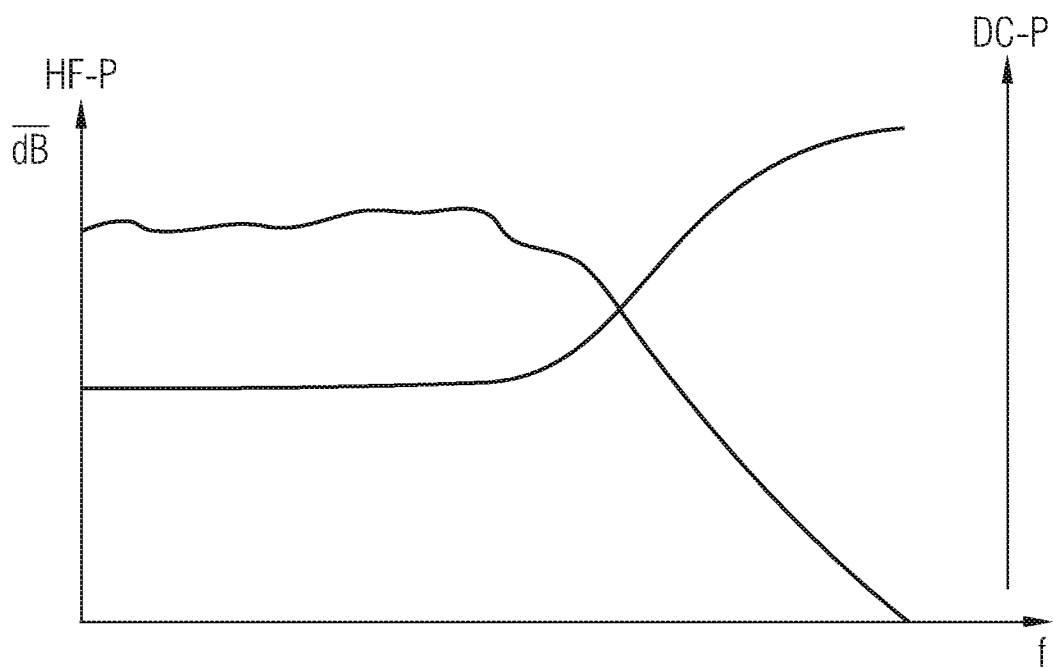
FIG. 3 shows an exemplary signal diagram displayed on a display unit of a measurement apparatus according to the present invention.

The processing unit 4 of the measurement apparatus 1 is adapted to perform a data evaluation of the high frequency parameters received from the high frequency measurement unit 2 and the low frequency DC characteristic parameters received from the multimeter unit 3. In a possible preferred embodiment, the processing unit 4 is adapted to evaluate the received high frequency parameters HFP and the received DC characteristic parameters DCP to derive automatically dependencies between the high frequency parameters HFP and the DC characteristic parameters DCP. In a possible embodiment, a user can select via the user interface 8 at least one high frequency parameter HFP and at least one DC characteristic parameter DCP so that they are displayed simultaneously on a display of the display unit 7. In a possible embodiment, the processing unit 4 can calculate a correlation value between a selected high frequency parameter HFP provided by the high frequency measurement unit 2 and a selected DC characteristic parameter DCP provided by the multimeter unit 3 and display a calculated correlation value between the two entities along with two entities on a display of the display unit 7. In a possible embodiment, the display unit 7 is adapted to display at least one frequency-dependent high frequency parameter HFP and at least one frequency-dependent DC characteristic parameter DCP simultaneously for a selectable frequency range as illustrated in the diagram of FIG. 3. FIG. 3 shows a possible exemplary view on a display of a display unit 7 of a selected high frequency parameter HFP and a selected DC characteristic parameter DCP over a predetermined frequency range. By simultaneously displaying the high frequency parameter HFP and the DC characteristic parameter DCP in a predetermined selectable frequency range, the user can immediately recognize a dependency between the high frequency parameter HFP and the DC characteristic parameter DCP of the device under test DUT. This can be supported by displayed correlation values and/or correlation curves calculated by the processing unit 4.

In a possible embodiment of the measurement apparatus 1 illustrated in FIGS. 1, 2, the control bus interface 6 comprises a radio frequency front end, RFFE, interface. The RFFE control bus interface comprises in a possible embodiment a clock signal line SCLK, a data signal line SDATA, an I/O supply/reference voltage VIO. The RFFE control bus interface 6 allows to connect several RFFE slave devices to an RFFE master. Accordingly, the RFFE control bus interface allows to connect up to 15 logical slaves on a single bus. The slave devices comprise components of an RFFE front end or front end module of a mobile phone. The front end module FEM can form a device under test DUT as illustrated in FIGS. 1, 2. The front end module FEM can comprise different components such as LNAs, PAs, antenna switches, antenna tuners, DC/DC converters, filters or sensors. The RFFE control bus 6 interface allows programming by using high speed low latency command transfers. Command sequences allow to accomplish, read and write accesses to slave device under test components DUT connected to the bus.

The display unit 7 of the measurement apparatus 1 is adapted to display in a possible embodiment linear and/or logarithmic sweeps in linear and logarithmic formats or polar formats as well as Smith charts etc. Further, the display unit 7 is adapted to display trace markers, limit lines as well as testing flags. In a possible embodiment, the measurement apparatus 1 according to the present invention is formed by a network analyzer adapted to measure components, circuits and subassemblies of a device under test DUT. The network analyzer forms a stimulus response system providing a measurement with a known generated signal.

In a further possible embodiment of the measurement apparatus 1 according to the present invention, the measurement apparatus 1 is formed by a spectrum analyzer. The spectrum analyzer is adapted to measure signal characteristics such as a carrier level, side bands, harmonics and/or a phase noise of an unknown input signal.

With the measurement apparatus 1 according to the present invention, dependencies between high frequency parameters HFP and low frequency DC characteristic parameters DCP can be detected by performing correlation calculations within the processing unit 4. The detected dependencies can be displayed on a graph such as illustrated in FIG. 3 and corresponding calculated correlation values between the high frequency parameters HFP and the DC characteristic parameters DCP can also be displayed on the display unit 7.

In a possible preferred embodiment, the processing unit is connected to a power supply unit 10 as shown in FIG. 2. During measurement of the high frequency parameters and the DC characteristic parameters, the processing unit 4 can control the power supply unit 10 to adjust a power supply voltage and/or a power supply current supplied to the device under test DUT during the measurement to evaluate an impact of the adjusted changed power supply on the different parameters during the high frequency and/or low frequency measurement. In a possible embodiment, the processing unit 4 further calculates correlation parameters CP between high frequency parameters HFP measured by the high frequency measurement unit 2 and adjusted power supply parameters of the power supply received by the device under test DUT during the test measurement. In a still further possible embodiment, the processing unit 4 is further adapted to calculate correlation values between low frequency DC characteristic parameters DCP measured by the multimeter unit 3 and power supply parameters of a power supply applied to the device under test DUT during the low frequency measurement performed by the multimeter unit 3. In this embodiment, the processing unit 4 can evaluate the impact of a power supply change on the high frequency parameters HFP and/or low frequency DC characteristic parameters DCP. In a possible embodiment of the measurement apparatus 1, the control bus interface 6 can be implemented in an interface card to be programmed directly on the basis of the firmware of the measurement apparatus 1.

In a further preferred embodiment of the measurement apparatus 1, the measurement apparatus 1 comprises a synchronization unit adapted to synchronize the high frequency measurements performed by the high frequency measurement unit 2 and the low frequency measurements performed by the multimeter unit 3 of the measurement apparatus 1. The synchronization allows for a precise and accurate calculation of correlation parameter CP values between high frequency parameters HFP and DC characteristic parameters DCP of the same measured device under test DUT. In a still further possible embodiment, the synchronization unit of the measurement apparatus 1 is also connected to the power supply unit 10 to synchronize a change of applied power supply parameters with the measurements performed by the high frequency measurement unit 2 and by the multimeter unit 3. In a still further possible embodiment, the synchronization unit of the measurement apparatus 1 is further adapted to synchronize a stimulus signal generated by the signal generator 9 with the measurements performed by the high frequency measurement unit 2 and by the multimeter unit 3 of the measurement apparatus 1. The synchronization can be performed in a possible embodiment using a common synchronization clock signal applied to the signal generator 9, to the high frequency measurement unit 2, to the multimeter unit 3 and/or to the power supply unit 10 of the measurement apparatus 1. In a further possible embodiment, the stimulus signal applied to the device under test DUT is displayed by the display unit 7 along with the measured high frequency parameters HFP and/or low frequency DC characteristic parameters DCP. The display unit 7 of the measurement apparatus 1 is configured to display in a selected display mode high frequency parameters HFP and/or low frequency parameters DCP together in the frequency domain as illustrated in FIG. 3. In a possible embodiment, the display unit 7 is further configured to display high frequency parameters HFP and DC characteristic parameters DCP together in a time grid in the time domain along with the stimulus signal generated by the built-in signal generator 9. In a possible embodiment, a user of the measurement apparatus 1 can select between a time domain display mode TDDM and a frequency domain display FDDM mode by means of the user interface 8 of the measurement apparatus 1. In a possible embodiment, the stimulus signal generated by the signal generator 9 is selected in response to a detected type of the device under test DUT. In a possible embodiment, the signal generator 9 can apply a sequence of different stimulus signals to the respective device under test DUT under the control of the processing unit 4 in a measurement session.

In a further possible embodiment, the display unit 7 of the measurement apparatus 1 comprises a touchscreen implementing the user interface 8 for selecting a display and/or different measurement modes of the measurement apparatus 1. In a possible embodiment, the user can input a type of the device under test DUT via the user interface 8 or via the touchscreen of the display unit 7. The user then may select different measurement modes and/or display modes for performing high frequency and/or DC characteristic measurements by the high frequency measurement unit 2 and by the multimeter 3 integrated in the measurement apparatus 1.

With the measurement apparatus 1 according to the present invention, the time required for performing testing of a device under test DUT is significantly reduced. Further, deeper insights into the behaviour of the device under test DUT can be achieved by calculating cross-link relation parameters between high frequency parameters HFP and DC characteristic parameters DCP of the device under test DUT. The measurement apparatus 1 according to the present invention can be used in a production process for quality control of a device under test and/or during a design phase when designing a device under test. In a possible embodiment, the measurement apparatus 1 comprises a data interface such as an USB interface and/or a LAN interface to output the test results to a local or remote control unit. In a possible embodiment, the multimeter unit 3 allows to measure the DC current and power supply voltage level individually for each control line CL of the control bus connected to the control bus interface 6 of the measurement unit 1. Accordingly, it is possible to measure the high frequency parameters HFP and the DC characteristic parameters DCP parallel in time. Only programming of the device under test DUT via the control bus is performed sequentially. The device under test DUT can comprise a component of a front end module FEM having in a possible implementation high impedance FET switches. The high impedance of the switching entities provide DC currents with a low amplitude of less than several nanoamperes nA. In a possible embodiment, the multimeter unit 3 can comprise at least one switchable shunt resistance for measuring even very low DC current parameters.

Figure 4:
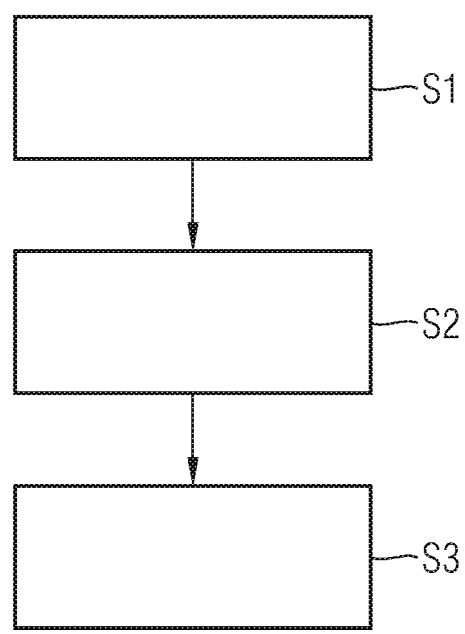
FIG. 4 shows a flow chart of an exemplary embodiment of a method for recognizing automatically a dependency between a high frequency behavior and a low frequency behavior of a device under test according to a first aspect of the present invention.

FIG. 4 shows a flowchart of a possible exemplary embodiment of a method for recognizing automatically a dependency between a high frequency behaviour and a low frequency behaviour of a device under test DUT. In a first step S1, at least one high frequency parameter HFP of the device under test DUT is measured by a high frequency measurement unit of a measurement apparatus. The high frequency parameter HFP can be for instance a scattering parameter of the device under test.

In a further step S2, at least one DC characteristic parameter of the device under test DUT is measured by a multimeter unit of the measurement apparatus.

The steps S1, S2 can be performed in a possible embodiment simultaneously by a high frequency measurement unit and a multimeter unit of the same measurement apparatus.

In a further step S3 correlation parameters CP are calculated on the basis of the high frequency parameters measured in step S1 and the DC characteristic parameters measured in step S2 to identify automatically a dependency between a high frequency behaviour and a low frequency behaviour of the device under test DUT.

The invention claimed is:
1. A measurement apparatus comprising:
a high frequency measurement unit adapted to measure high frequency parameters of a device under test;
a test interface connected to the high frequency measurement unit and comprising test ports being connectable to the device under test to connect the high frequency measurement unit to the device under test;
a multimeter unit adapted to measure DC characteristics of said device under test;
a control bus interface comprising a radio frequency front end interface, said control bus interface being connected between the multimeter unit and the device under test, and being connectable via control signal lines to the device under test to connect the multimeter unit with the device under test; and
a signal generator adapted to supply a stimulus signal to the device under test via the test interface, wherein the signal generator is adapted to sweep the power level of the stimulus signal over a predetermined range,
wherein the test interface is adapted to receive the stimulus signal and to route it to the device under test; and
wherein the high frequency measurement unit is adapted to determine the frequency response of the device under test.

2. The measurement apparatus according to claim 1 wherein a measurement of said DC characteristics by said multimeter unit and a measurement of said high frequency parameters by said high frequency measurement unit is performed simultaneously.

3. The measurement apparatus according to claim 1, wherein the multimeter unit is adapted to measure a DC current and/or a DC supply voltage at each of said control signal lines connected to said control bus interface.

4. The measurement apparatus according to claim 1 comprising a display unit adapted to display at least one high frequency parameter measured by said high frequency measurement unit simultaneously with at least one DC characteristic parameter measured by said multimeter unit.

5. The measurement apparatus according to claim 1, wherein said high frequency measurement unit is adapted to measure scattering parameters of said device under test comprising
a forward reflection coefficient,
a reverse reflection coefficient,
a forward transmission coefficient and
a reverse transmission coefficient and/or adapted to measure a bode diagram.

6. The measurement apparatus according to claim 4, wherein the display unit is adapted to display a frequency-dependent high frequency parameter and a frequency-dependent DC characteristic parameter simultaneously for a selectable frequency range.

7. The measurement apparatus according to claim 1, wherein the measurement apparatus comprises an integrated power supply unit adapted to provide a power supply to the device under test.

8. The measurement apparatus according to claim 1, wherein the multimeter unit comprises a digital multimeter unit adapted to measure DC characteristic parameters of each control signal line connected to said control bus interface.

9. The measurement apparatus according to claim 1, wherein the multimeter unit is implemented on a plug-in card of said measurement apparatus or connected via a data interface to said measurement apparatus.

10. The measurement apparatus according to claim 1, wherein the processing evaluation unit of said measurement apparatus is adapted to evaluate the high frequency parameters measured by said high frequency measurement unit and the DC characteristic parameters measured by said multimeter unit to analyze the device under test and to identify a dependency between a high frequency behaviour and a low frequency behaviour of said device under test.

11. The measurement apparatus according to claim 1, wherein the measurement apparatus comprises a vector network analyser or a spectrum analyser.

12. A method for recognizing automatically a dependency between a high frequency behaviour and a low frequency behaviour of a device under test comprising the steps of:
  measuring at least one high frequency parameter of the device under test by a high frequency measurement unit of a measurement apparatus, wherein said measurement unit is connected to the device under test via a test interface comprising test ports connected to the device under test;
  measuring at least one DC characteristic parameter of the device under test simultaneously by a multimeter unit of said measurement apparatus, wherein a control bus interface is connected between said multimeter unit and the device under test, wherein said control bus interface comprises a radio frequency front end interface and is connected via control signal lines to the device under test; and
  calculating correlation parameters on the basis of the measured high frequency parameters and the measured DC characteristic parameters to identify a dependency between a high frequency behaviour and a low frequency behaviour of said device under test,
  wherein a stimulus signal is supplied to the device under test, wherein the power level of the stimulus signal is swept over a predetermined range, and
  wherein the frequency response of the device under test is determined by the high frequency measurement unit.

13. The measurement apparatus according to claim 1, further comprising a synchronization unit adapted to synchronize the high frequency measurements performed by the high frequency measurement unit and the low frequency measurements performed by the multimeter unit.

* * * * *